United States Patent [19]
Bell

[11] Patent Number: 5,699,954

[45] Date of Patent: Dec. 23, 1997

[54] DEVICE FOR SECURING AN ELECTRONIC COMPONENT TO A PIN GRID ARRAY SOCKET

[75] Inventor: James S. Bell, Cedar Park, Tex.

[73] Assignee: Dell U.S.A., L.P., Austin, Tex.

[21] Appl. No.: 763,932

[22] Filed: Dec. 12, 1996

Related U.S. Application Data

[62] Division of Ser. No. 504,812, Jul. 20, 1995, abandoned.

[51] Int. Cl.$^6$ ..................................................... H05K 3/34
[52] U.S. Cl. .......................... 228/180.1; 228/189; 29/840
[58] Field of Search ........................ 228/180.1, 189, 228/179.1, 212; 29/837, 840; 174/52.4; 257/697; 361/785

[56] References Cited

U.S. PATENT DOCUMENTS

| | | | |
|---|---|---|---|
| 4,985,989 | 1/1991 | Murphy | 29/829 |
| 5,140,745 | 8/1992 | McKenzie, Jr. | 29/852 |
| 5,241,453 | 8/1993 | Bright et al. | 361/704 |

FOREIGN PATENT DOCUMENTS

| | | | |
|---|---|---|---|
| 3-34279 | 2/1991 | Japan | 324/765 |

*Primary Examiner*—Samuel M. Heinrich
*Attorney, Agent, or Firm*—Haynes and Boone, L.L.P.

[57] ABSTRACT

The present invention is directed to a device for securing an electrical component to a pin grid array (PGA) socket that has a substantially planar body portion and a plurality of conductor pins, which are electrically connectable to a circuit board and project outwardly in a direction substantially perpendicular to the planar body portion. The device comprises a base member that has a plurality of conductor pin apertures which extend through the base member. Each of the conductor pin apertures are registered to receive therethrough a corresponding one of the plurality of conductor pins, to thereby sandwich the base member between and anchor the base member to the circuit board and the PGA socket when the PGA socket is electrically connected to the circuit board. The device further comprises a means for releasably securing the electrical component to the PGA socket. The means is coupled to the base member and a surface of the electrical component and transmits a retaining force from the base member to the electrical component, thereby substantially preventing the electrical component from separating from the PGA socket.

7 Claims, 3 Drawing Sheets

DEVICE FOR SECURING AN ELECTRONIC COMPONENT TO A PIN GRID ARRAY SOCKET

This is a divisional Of application Ser. No. 08/504,812 filed On Jul. 20, 1995, now abandoned.

BACKGROUND OF THE INVENTION

The present invention is directed generally to a securing device for a computer component, and more specifically is directed to a device for securing an electronic component, such as a central processing unit, to a pin grid array electrically attached to a circuit board.

As computer systems grow in speed and shrink in size, power consumed within the computer per unit volume (power density) increases dramatically. Thus, it becomes evermore important to dissipate the heat generated by components within the computer during operation to ensure that the components remain within their normal operating temperature ranges. This reduces a chance that the components will fail immediately or have too short a lifetime.

In early desktop personal computers, components were passively cooled by radiation or convection, the surfaces of the components themselves interfacing directly with still air surrounding the component to transfer heat thereto. Unfortunately, air is not a particularly good conductor of heat. Therefore, in the early desktop computers, the heated air tended to become trapped, clinging to the components, acting as a thermal insulator and increasing component operating temperature. Eventually, computers were provided with fans to force air over the surfaces of the components, increasing the temperature differential between the surface of the component and the surrounding air to increase the efficiency of heat transfer. The increased temperature differential overcame some of the poor heat-conducting qualities of air.

Of all components in a computer, the microprocessor central processing unit ("CPU") liberates the most heat during operation of the computer. This springs from its role as the electrical center of attention in the computer. Thus, in prior art computers, motherboards were designed to position the CPU in the flow of air from a cooling fan; other heat-producing components were located away from the CPU to afford maximum cooling of the CPU.

As new generations of microprocessors have arrived, however, this relatively simple scheme has become decidedly inadequate, risking destruction of the CPU. It has thus become common to associate a heat sink with the CPU to increase the heat-dissipating surface area of the CPU for more effective cooling. Such heat sinks have a plurality of heat-dissipating projections or elements on a surface thereof (an "upper surface," for purposes of discussion). Another surface of the heat sink (the "lower surface") is placed proximate the component and a retention clip is employed to wrap around the heat sink, gripping a lower surface of the CPU component with inward-facing projections.

The component and the heat sink therefore become a single assembly that can be attached to the motherboard. Typically, in more expensive PCs, the CPU is inserted in a zero insertion force (ZIF) socket in a single step. ZIF sockets are designed to be directly soldered to the circuit board and provide a plurality of apertures on an upper surface thereof for receiving the component pins. The apertures do not contain spring-loaded contacts, but accept each component pin without substantial frictional resistance. An arm is rotatably mounted to the ZIF socket. Rotation of the arm causes a relative translation of portions of the ZIF socket with respect to each other. The portions place the component pins in a mechanical shear or bind within the apertures.

As such, the mechanical bind brings about a good electrical contact for each of the component pins. The combined mechanical bind of all of the apertures presents a substantial retention force to hold the component in the ZIF socket. Moreover, ZIF sockets do not need to sacrifice individual aperture retention force and concomitant electrical contact integrity to keep total insertion or extraction forces to an acceptable level. Thus, ZIF sockets therefore typically have high retention forces. While ZIF sockets work well in most instances, they are, unfortunately, expensive components and add to the overall cost of the PC. Thus, in those instances where the manufacturer is attempting to provide the consumer with a less expensive PC, it is desirable to use less costly components in the PC.

This desirable cost reduction is partially achieved with the use of a low retention force (LRF) pin grid array (PGA) socket in place of the more expensive ZIF socket. The LRF is soldered to the motherboard and is used to connect the CPU to the motherboard. The LRF PGA is a conventional PGA socket that has multi-conductive connector pins projecting from one side with corresponding sockets on the opposite side of the PGA socket. Of course, in some instances, the PGA socket may have either connector pins or sockets on both sides of the PGA socket, but in most instances, the CPU is connected to the LRF socket by inserting corresponding pins of the CPU in corresponding sockets of the LRF PGA socket.

These less expensive LRF sockets, however, do have a significant disadvantage associated with their use. While the LRF socket is generally sufficient to hold the CPU in the correct connected position they do, however, have a significant disadvantage associated with their use. This disadvantage is that when a heat sink is attached to the CPU, the retention force may no longer be adequate to hold the combined weight of CPU and the heat sink in the LRF socket. The reason for this failing retention force is because heat sink/component assemblies are, unfortunately, relatively heavy. This becomes most disadvantageous when the PC is transported. As the PC is rotated, bumped and jarred, the weight of the heat sink/component assembly generates forces sufficient to dislodge the assembly from its LRF socket. If forces are of sufficient strength, even components that do not have a heat sink attached may generate enough force to become dislodged from a LRF socket.

Other type of retention devices, known in the art that are used to overcome the deficiencies of the LRF PGA socket include forming tab-like projections on the edges of the PGA socket to provide a gripping surface under the projections for an elongated clamp that extends over the CPU and heat sink and down to the tab-like projection. The disadvantage with this system is that the PGA socket must be special ordered. As such, the component is not readialy available and is more expensive, thereby adding to the cost of the PC.

Thus, what is needed in the art is an inexpensive electronic component clip device that will hold a CPU attached to a heat sink in a PGA socket in all instances. The device of the present invention provides both of these advantages.

SUMMARY OF THE INVENTION

To address the above-discussed deficiencies of the prior art, it is a primary object of the present invention to provide a clamping device for securing an electrical component to a pin grid array (PGA) socket that has a substantially planar body portion and a plurality of conductor pins, which are electrically connectable to a circuit board. The clamping device comprises a base member that has a plurality of conductor pin apertures which extend through the base member. Each of the conductor pin apertures are registered to receive therethrough a corresponding one of the plurality of conductor pins, to thereby sandwich the base member between and anchor the base member to the circuit board and the PGA socket when the PGA socket is electrically connected to the circuit board. The device further comprises a means for releasably securing the electrical component to the PGA socket. The means is coupled to the base member and a surface of the electrical component and transmits a retaining force from the base member to the electrical component, thereby substantially preventing the electrical component from separating from the PGA socket.

In another aspect of the present invention, the base member has a generally planar portion, and the means for releasably securing is comprised of an elongated, resilient clamping projection integrally formed with and extending from the base member in a direction substantially perpendicular to the planar portion. The clamping projection extends a distance sufficient to engage a top surface of the electrical component and securely hold the electrical component to the PGA socket. In a more preferred embodiment, however, the base member has a plurality of the clamping projections. Preferably, the projections are comprised of two opposite diagonally disposed elongated, resilient clamping projections In yet another embodiment, the base member has a generally planar rectangular shape with a perimeter side surface about the base member. The means for releasably securing is comprised of clamping tab members disposed on opposite sides of the base member and an elongated spring-like clip member. The tab member extend outwardly from the base member in a direction perpendicular to the side surface, and the elongated spring-like clip member has opposing inwardly curved end portions with a length sufficient to extend from the electronic component to the tab members and engage a bottom surface of the tab members, to thereby securely hold the electrical component to the PGA socket.

In another aspect of the present invention, a system for securing electrical components to a printed circuit board for use in a personal computer (PC) is provided. The system comprises a pin grid array (PGA) socket that has a substantially planar body portion and a plurality of conductor pins, which are electrically connectable to a circuit board and project outwardly in a direction substantially perpendicular to the planar body portion. The system further comprises an electrical component configured to be coupled to the PGA socket, a base member having a plurality of conductor pin apertures extending therethrough. Each of the conductor pin apertures is registered to receive therethrough a corresponding one of the plurality of conductor pins, to thereby anchor the base member to and between the circuit board and the PGA socket when the PGA socket is electrically connected to the circuit board.

The system further comprises a fastening device for releasably securing the electrical component to the PGA socket. The fastening device couples the base member to a surface of the electrical component and transmits a retaining force from the base member to the electrical component, thereby substantially preventing the electrical component from separating from the PGA socket.

In another aspect of the embodiment just described, the electrical component, which is preferably a central processing unit, has a plurality of conductive connecting pins extending from a surface opposing the PGA socket. The PGA socket has a substantially planar body with opposite first and second sides, and the conductor pins pass through the body and have male and female ends. The female ends open outwardly from the first side to form socket openings that are adapted and registered to receive the connecting pins of the electronic component. The male ends that extend outwardly from the second side are electrically connectable to the circuit board.

In yet another aspect of the embodiment just described, the base member has a generally planar portion, and the fastening device is comprised of an elongated, resilient clamping projection integrally formed with and extends from the base member in a direction substantially perpendicular to the planar portion. The fastening device extends a distance sufficient to engage a top surface of the electrical component and securely hold the electrical component to the PGA socket.

Alternatively, the base member may have a generally planar portion, and the fastening device may be comprised of a plurality of spaced apart elongated, resilient clamping projections that are integrally formed with and extend from the base member in a direction substantially perpendicular to the planar portion. The fastening device extends a distance sufficient to engage a top surface of the electrical component, to thereby securely hold the electrical component to the PGA socket. Preferably, the fastening device is comprised of two opposite diagonally disposed, elongated, resilient clamping projections that are integrally formed with and extend from the base member.

Alternatively, however, the base member may further comprise a perimeter side surface around the planar surface, and the means for releasably securing may be comprised of clamping tab members disposed on opposite sides of the base member and an elongated spring-like clip member. The clamping tab members preferably extend outwardly from the base member in a direction perpendicular to the side surface. The elongated spring-like clip member preferably has opposite curved end portions with a length sufficient to extend from the electronic component to the tab members and engage a bottom surface of the tab members, to thereby securely hold the electrical component to the PGA socket.

In another aspect of the present invention, a method for securing electrical components to a circuit board having a plurality of securing openings therethrough is provided. The method steps comprise placing a base member on the circuit board in a manner to register a plurality of conductor pin apertures formed through the base member with the plurality of securing openings, registering and inserting a plurality of conductor pins projecting outwardly from a pin grid array (PGA) socket through the plurality of conductor pin apertures and the plurality of securing openings and sandwiching the base member between and anchoring the base member to the circuit board and the PGA socket, and soldering the PGA socket to the circuit board.

The method preferably further comprises the step of securing an electrical component, such as a central processing unit, to the PGA socket by a releasable securing means. The means couples the base member to a surface of the electrical component and transmits a retaining force from the base member to the electrical component, thereby substantially preventing the electrical component from separating from the PGA socket.

The foregoing has outlined rather broadly the features and technical advantages of the present invention so that the detailed description of the invention that follows may be better understood.

Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
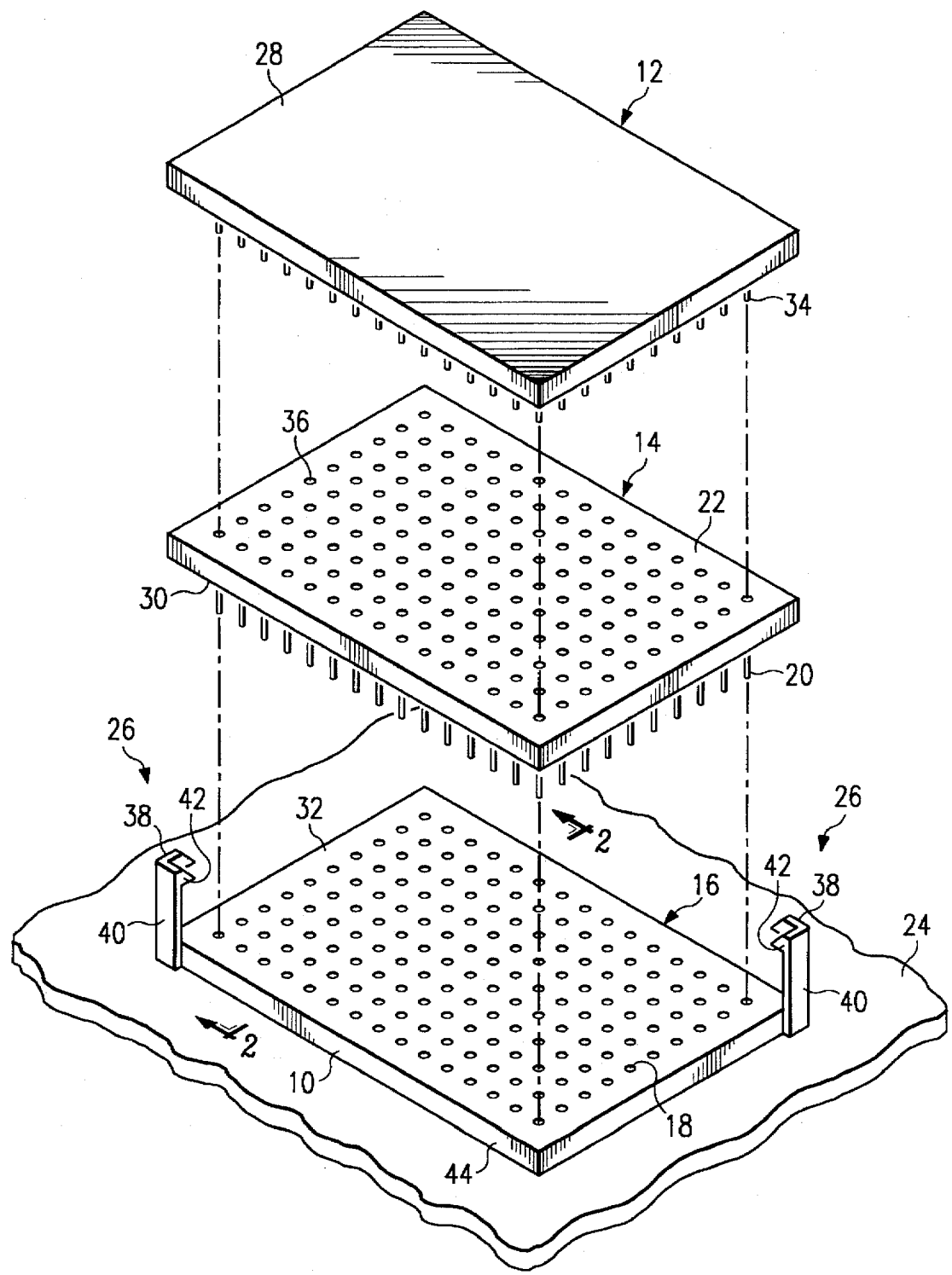
FIG. 1 illustrates an exploded view of the clamping device of the present invention, a PGA socket and an electrical component.

Referring initially to FIG. 1, in a preferred embodiment thereof, a clamping device 10 for securing an electrical component 12 to a pin grid array (PGA) socket 14 is provided. The clamping device 10 is comprised of a generally rectangular, planar base member 16, preferably a molded plastic material, having a plurality of conductor pin apertures 18 extending therethrough. Each of the conductor pin apertures 18 are registered to receive a corresponding one of a plurality of conductor pins 20 projecting outwardly from a generally planar body portion 22 of the PGA socket 14 and in a direction substantially perpendicular to the planar body portion 22. The conductor pins 20 are electrically connectable to a circuit board 24 in a conventional manner by positioning the plurality of conductor pins 20 through corresponding conductor pin apertures formed in the circuit board 24 and then soldering the pins in place. As the PGA socket 14 is being positioned on the circuit board 24, the clamping device 10 is positioned between the circuit board 24, and the paner body portion of an electrical component 12, and the conductor pin apertures 18 of the clamping device 10 are aligned to correspondingly receive the conductor pins 20 of the PGA socket 14. The PGA socket 14 is positioned on the circuit board 24 to effectively sandwich the clamping device 10 between and anchor it to the circuit board 24 and the PGA socket 14.

The clamping device 10 is preferably comprised of a generally rectangular planar base member 16 that is of generally, but not specifically, the same size and geometrical configuration as the PGA socket 14. The clamping device preferably has an elongated, resilient clamping projection 26 that is integrally formed with and extends from the base member 16 in a substantially perpendicular direction. The clamping projection 26 is of a length sufficient to engage a top surface 28 of an electrical component 12 and securely hold the electrical component 12 to the PGA socket 14 when the electrical component is coupled to the PGA socket 14. Preferably, the base member 16 has a plurality of clamping projections 26 extending therefrom, and more preferably, the clamping projections 26 are a pair of clamping projections that are disposed on opposite diagonal corners of the base member 16, as illustrated.

A preferred embodiment of the PGA socket 14 is illustrated as having conducting pins 20 extending from one side and corresponding sockets 36 on the opposite side for receiving the conductive connecting pins 34 of the electrical component 12. However, it will, of course, be appreciated that the PGA socket 14 may have conductor pins extending from both sides, and the electrical component 12 may have corresponding sockets for receiving one set of the conductor pins therein with the other set of conductors pins being received through the conducting pin apertures 18 of the clamping device 10.

Figure 2:
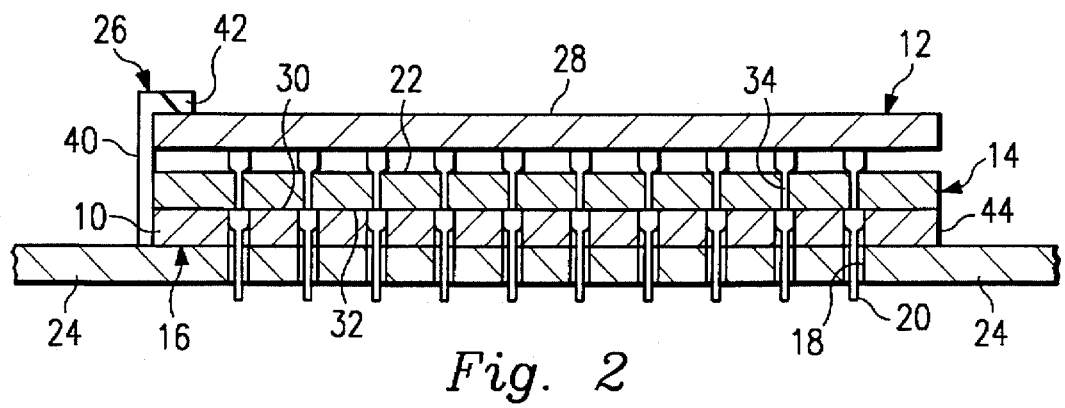
FIG. 2 illustrates a cross-section of FIG. 1 taken along line 2—2 of the clamping device sandwiched between a PGA socket and the circuit board and the electrical component secured to the PGA socket by the clamping projection of the clamping device.

Turning now to FIG. 2, there is illustrated a cross-sectional view of the clamping device 10 of the present invention with electrical component being held to the PGA socket via the clamping device 10. In this configuration, the PGA socket 14 is electrically connected to the circuit board 24 and the clamping device 10 is sandwiched between the PGA socket 14 and the circuit board 24, as illustrated. The conductor pins 20 of the PGA socket 14, preferably extend fully through the conductor pin apertures 18 of the clamping device 10 and through the circuit board 24, thereby causing the lower surface 30 of the PGA socket 14 to come into physical contact with the upper surface 32 of the clamping device 10. In the illustrated embodiment, the thickness of the clamping device 10 is shown to be equal to that of the PGA socket 14 and the electrical component 12. However, in some other embodiments, the thickness of the clamping device 10 may be much thinner than that of the PGA socket 14. The electrical component 12 is shown electrically connected to the PGA socket 14. The plurality of the conductive connecting pins 34 of the electrical component 12 are registered with and inserted in corresponding sockets 36 of the PGA socket 14 to make electrical contact therewith.

The clamping projection 26 is shown engaging the top surface 28 of the electrical component 12. Preferably, the clamping projection 26 has two intersecting side portions 38, 40 that form an interior corner, which is configured to receive and hold a corner portion of the electrical component 12. The clamping projection 26 has a grasping portion 42 that extends over and engages the top surface 28 of the electrical component 12. The resilency of the clamping projections 26 allow them to be bent outward as the electrical component 12 is positioned in the PGA socket 14. The length of the clamping projection 26 may, of course, vary depending on the design and application, but in any application, the length must be sufficient to extend from the clamping device 10 to the electrical component 12 to securely engage a surface of the electrical component and provide a retaining force from the base member 16 to the electrical component 12. However, in a preferred embodiment, the length is sufficient to span the combined thickness of the PGA socket 14 and the electrical component 12 and engage the top surface 28 of the electrical component 12 when the components are assembled on the circuit board 24, as illustrated.

Figure 3:
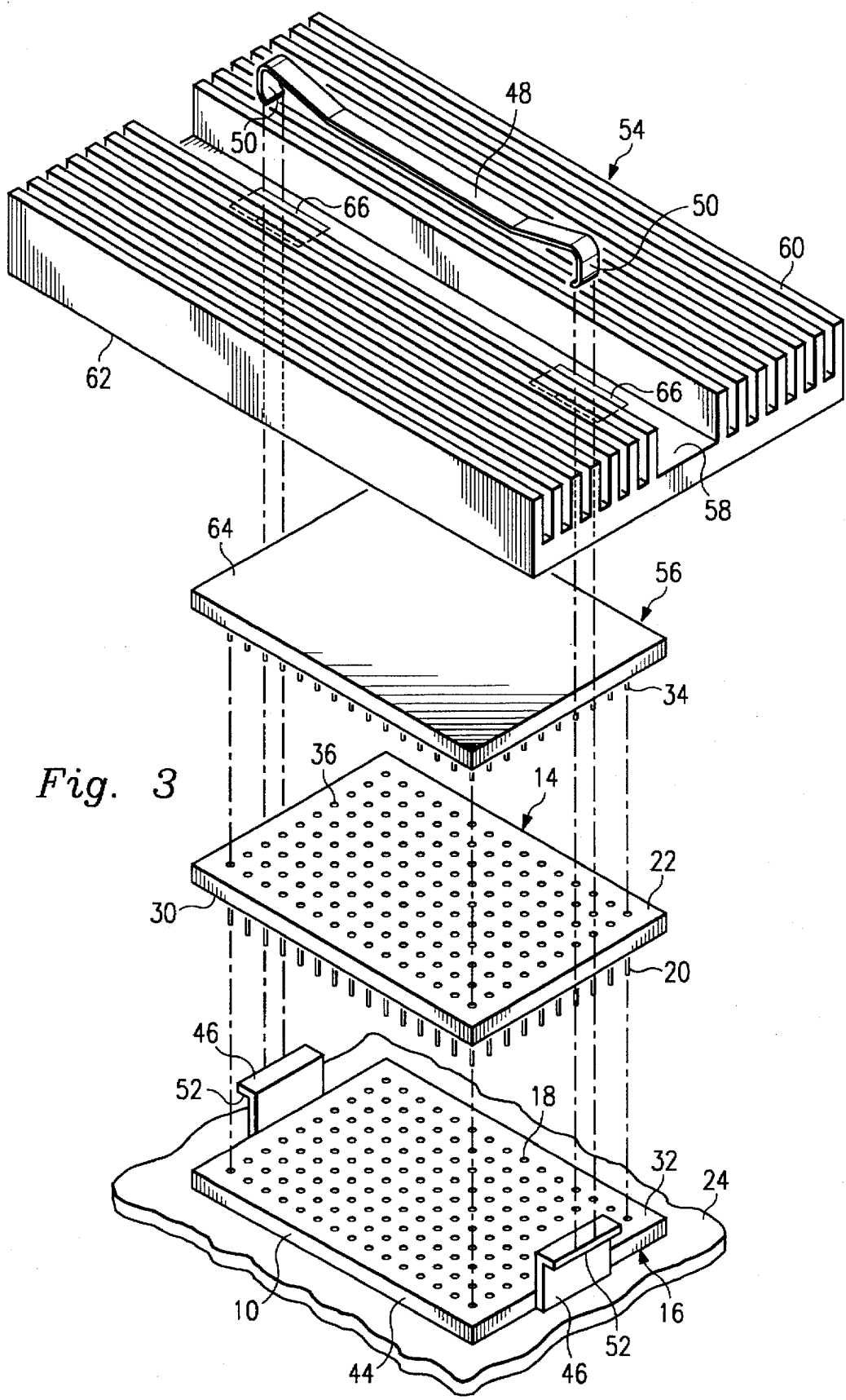
FIG. 3 illustrates an exploded view of an alternate embodiment of the present invention with clamping device having tab members extending outwardly therefrom that are engage with a clip device designed to secure a heat sink and a central processing unit to the PGA socket.

Turning now to FIG. 3, illustrated is an alternate embodiment of the clamping device of the present invention. In this particular embodiment, the clamping device 10 has a base member 16 with a perimeter side surface 44 formed thereabout. The base member 16 includes conductor pin apertures 18 formed therethrough that are registered to receive the corresponding conductor pins 20 of the PGA socket 14. The base member 16 further includes clamping tab members 46 disposed on opposite sides of the base member 16 that extend outwardly from the base member 16 in a direction perpendicular to the side surface 44. The means for releasably securing the electrical component 12 to the PGA socket 14 is preferably comprised of the clamping tab members 46 and an elongated spring-like clip member 48 having opposing inwardly curved end portions 50 depending therefrom. The curved end portions 50 have a length sufficient to extend from the electrical component 12 to the tab members 46 and engage a bottom surface 52 of the tab members 46 to thereby securely hold the electrical component 12 to the PGA socket 14.

Figure 4:
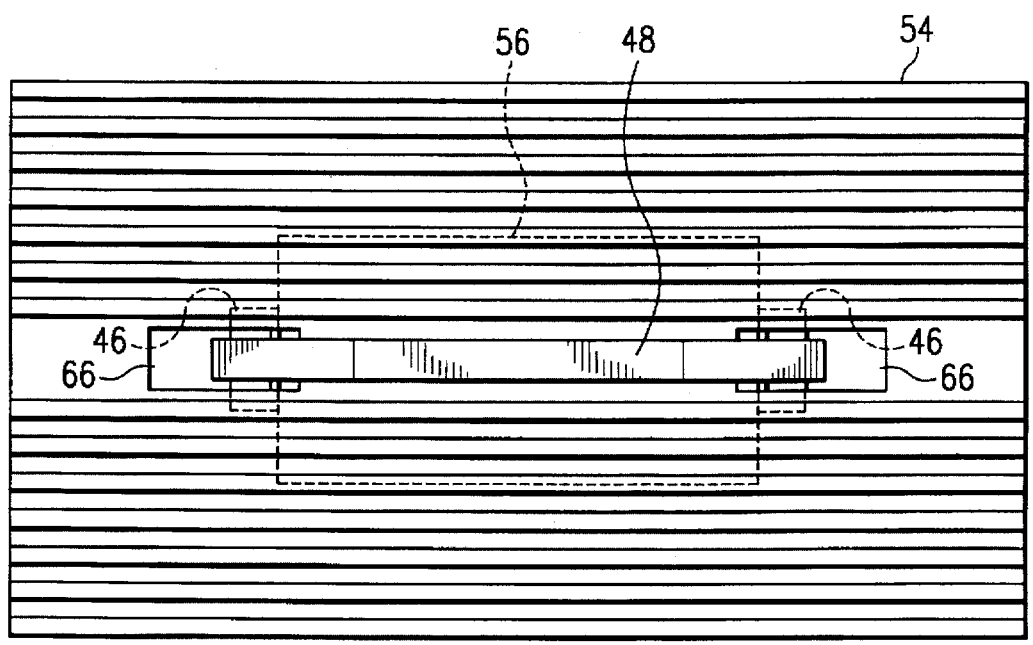
FIG. 4 illustrates a top view of the heat sink positioned on the central processing unit with the heat sink and central processing unit secured to the PGA socket with the clip device and the tab members.

In one application of this alternate embodiment, the electrical component may be a conventional heat sink 54 coupled to a central processing unit 56. The heat sink is comprised of an elongated body member 58 having a plurality of fins 60 extending along the length thereof and transverse to the body member 58 for dissipating heat from the central processing unit 56. The lower surface 62 of the heat sink 54 is placed proximate the top surface 64 of the central processing unit 56. The heat sink 54 generally has two opposing openings 66 formed through the body member 58 for receiving the curved end portions 50 of the clip member 48 therethrough. The clip member 48 simultaneously secures both the heat sink 54 and the central processing unit 56 to the PGA socket 14 via the retaining force that is generated by the curved end portions 50 of the clip member 48 engaging the bottom surface 52 of the clamping tab members 46. Of course, it will be appreciated that this alternate embodiment could also be used in those instance where a heat sink is not present. FIG. 4, simply illustrates a top view of the heat sink 54 positioned on the central processing unit 56 with the clip member 48 coupled to the clamping tab members 46.

From the above, it is apparent that the present invention provides a device for securing an electrical component to a pin grid array (PGA) socket that has a substantially planar body portion and a plurality of conductor pins, which are electrically connectable to a circuit board and project outwardly in a direction substantially perpendicular to the planar body portion. The device comprises a base member that has a plurality of conductor pin apertures which extend through the base member. Each of the conductor pin apertures are registered to receive therethrough a corresponding one of the plurality of conductor pins, to thereby sandwich the base member between and anchor the base member to the circuit board and the PGA socket when the PGA socket is electrically connected to the circuit board. The device further comprises a means for releasably securing the electrical component to the PGA socket. The means is coupled to the base member and a surface of the electrical component and transmits a retaining force from the base member to the electrical component, thereby substantially preventing the electrical component from separating from the PGA socket.

Although the present invention and its advantages have been described in detail, it should be understood that various changes, substitutions and alterations can be made herein without departing from the spirit and scope of the invention as defined by the appended claims.

What is claimed is:

1. A method for securing electrical components to a circuit board having a plurality of securing openings therethrough, the method steps comprising:

placing a base member on said circuit board in a manner to register a plurality of conductor pin apertures formed through said base member with said plurality of securing openings;

registering and inserting a plurality of conductor pins projecting outwardly from a pin grid array (PGA) socket through said plurality of conductor pin apertures and said plurality of securing openings and sandwiching said base member between and anchoring said base member to said circuit board and said PGA socket; and soldering said PGA socket to said circuit board.

2. The method of claim 1 further comprising the step of securing an electrical component to said PGA socket by a releasable securing means, said means coupling said base member to a surface of said electrical component and transmitting a retaining force from said base member to said electrical component, thereby substantially preventing said electrical component from separating from said PGA socket.

3. The method of claim 2 wherein said wherein said base member has a generally planar portion and said releasable securing means is comprised of an elongated, resilient clamping projection integrally formed with and extending from said base member in a direction substantially perpendicular to said planar portion and a distance sufficient to engage a top surface of said electrical component and securely hold said electrical component to said PGA socket.

4. The device of claim 2 wherein said base member has a generally planar portion and said releasable securing means is comprised of a plurality of spaced apart, elongated, resilient clamping projections integrally formed with and extending from said base member in a direction substantially perpendicular to said planar portion and a distance sufficient to engage a top surface of said electrical component, to thereby securely hold said electrical component to said PGA socket.

5. The device of claim 2 wherein said base member is comprised of molded plastic material and has a generally planar rectangular shape portion and said releasable securing means is comprised of two opposite diagonally disposed elongated, resilient clamping projections integrally formed with and extending from said base member in a direction substantially perpendicular to said planar rectangular portion, said clamping projections extending a distance sufficient to engage a top surface of said electrical component, to thereby securely hold said electrical component to said PGA socket.

6. The device of claim 2 wherein said base has a generally planar rectangular shape and a perimeter side surface thereabout and said releasable securing means is comprised of clamping tab members disposed on opposite sides of said base member and extending outwardly from said base member in a direction perpendicular to said side surface and an elongated spring-like clip member having opposing inwardly curved end portions depending therefrom, said curved end portions having a length sufficient to extend from said electronic component to said tab members and engage a bottom surface of said tab members, to thereby securely hold said electrical component to said PGA socket.

7. The method of claim 2 wherein said electrical component is a central processing unit.

* * * * *